United States Patent
Kikkawa

(10) Patent No.: US 8,603,871 B2
(45) Date of Patent: Dec. 10, 2013

(54) COMPOUND SEMICONDUCTOR DEVICE AND ITS MANUFACTURE METHOD

(75) Inventor: Toshihide Kikkawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/454,349

(22) Filed: Apr. 24, 2012

(65) Prior Publication Data

US 2012/0208331 A1 Aug. 16, 2012

Related U.S. Application Data

(60) Division of application No. 12/548,622, filed on Aug. 27, 2009, now Pat. No. 8,183,572, which is a continuation of application No. PCT/JP2007/053689, filed on Feb. 27, 2007.

(51) Int. Cl.
*H01L 21/335* (2006.01)

(52) U.S. Cl.
USPC .................................. 438/172; 257/E21.403

(58) Field of Classification Search
None
See application file for complete search history.

(56) References Cited

U.S. PATENT DOCUMENTS

| | | | |
|---|---|---|---|
| 6,396,085 B1 | 5/2002 | Yoshida | |
| 7,417,257 B2 | 8/2008 | Beach et al. | |
| 8,008,749 B2 * | 8/2011 | Sugimoto et al. | 257/615 |
| 2001/0040246 A1 | 11/2001 | Ishii | |
| 2002/0182791 A1 | 12/2002 | Yoshida | |
| 2003/0098462 A1 | 5/2003 | Yoshida | |
| 2004/0157355 A1 | 8/2004 | Kachi et al. | |
| 2005/0023555 A1 | 2/2005 | Yoshida et al. | |
| 2005/0145883 A1 | 7/2005 | Beach et al. | |
| 2005/0258450 A1 | 11/2005 | Saxler | |
| 2006/0214196 A1 | 9/2006 | Saxler | |
| 2006/0219997 A1 | 10/2006 | Kawasaki et al. | |

FOREIGN PATENT DOCUMENTS

| | | |
|---|---|---|
| EP | 1 708 275 A2 | 10/2006 |
| JP | 2002-016262 A | 1/2002 |
| JP | 2003-051508 A | 2/2003 |
| JP | 2004-031896 A | 1/2004 |
| JP | 2005-203753 A | 7/2005 |
| JP | 2006-140368 A | 6/2006 |
| WO | 03/071607 A1 | 8/2003 |
| WO | 2006/052025 A2 | 5/2006 |
| WO | WO 2006052025 A2 * | 5/2006 ............. H01L 29/06 |

OTHER PUBLICATIONS

International Search Report of PCT/JP2007/053689 and Forms PCT/ISA/220, PCT/ISA/237, and partial translations thereof, mailed on Jun. 5, 2007.

(Continued)

*Primary Examiner* — Thomas L Dickey
*Assistant Examiner* — Joseph Schoenholtz
(74) *Attorney, Agent, or Firm* — Westerman, Hattori, Daniels & Adrian, LLP

(57) ABSTRACT

A vertical type GaN series field effect transistor having excellent pinch-off characteristics is provided. A compound semiconductor device includes a conductive semiconductor substrate, a drain electrode formed on a bottom surface of the conductive semiconductor substrate, a current blocking layer formed on a top surface of the conductive semiconductor substrate, made of high resistance compound semiconductor or insulator, and having openings, an active layer of compound semiconductor burying the openings and extending on an upper surface of the current blocking layer, a gate electrode formed above the openings and above the active layer, and a source electrode formed laterally spaced from the gate electrode and formed above the active layer.

10 Claims, 7 Drawing Sheets

(56) References Cited

OTHER PUBLICATIONS

Ilan Ben-Yaacov et al. "AlGaN/GaN Current Aperture Vertical Electron Transistors" Conference Digest of Device Research Conference, 2002, pp. 31-32.
Ilan Ben-Yaacov et al. "Analysis of Leakage Currents in AlGaN/GaN Current Aperture Vertical Electron Transistors (CAVETs)" Materials Research Society Proceedings, vol. 764, 2003, C4.8.1-6.
Ilan Ben-Yaacov "AlGaN/GaN Current Aperture Vertical Electron Transistors" Diss. University of California at Santa Barbara (2004).
Extended European Search Report dated Jun. 19, 2012, issued in corresponding application No. 07715024.1.
Japanese Office Action dated Jun. 5, 2012, issued in corresponding Japanese Patent Application No. 2009-501080 w/English translation. (3 pages).

* cited by examiner

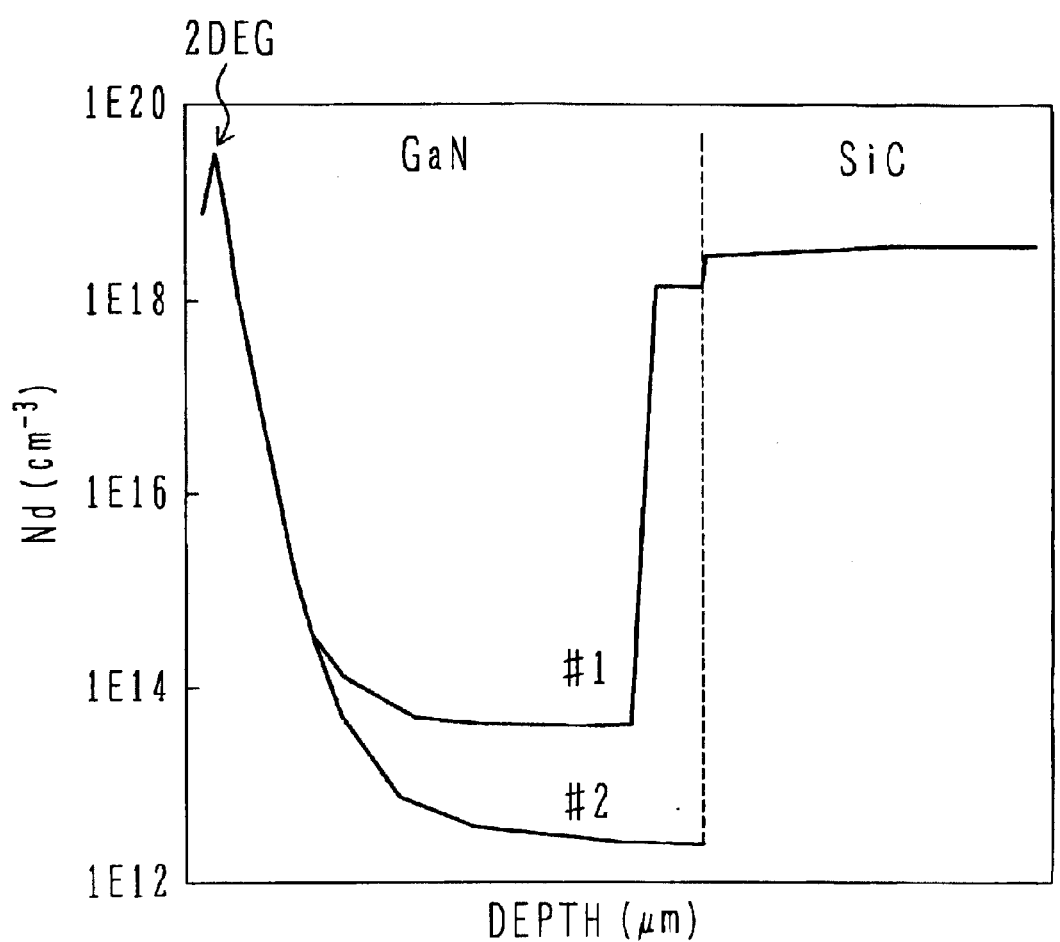

COMPOUND SEMICONDUCTOR DEVICE AND ITS MANUFACTURE METHOD

CROSS-REFERENCE TO RELATED APPLICATIONS

This application is a divisional of U.S. application Ser. No. 12/548,622, filed on Aug. 27, 2009, which is a Continuation Application of International Application No. PCT/JP2007/053689 filed on Feb. 27, 2007, the entire contents of which being incorporated herein by reference.

FIELD

The embodiments discussed herein are related to a compound semiconductor device and its manufacture method, and more particularly to a compound semiconductor device having a vertical current path and its manufacture method.

GaN series (compound semiconductor) indicates $Al_{x}In_{y}Ga_{1-x-y}N$ ($0 \leq x \leq 1.0$, $0 \leq y \leq 1.0$).

BACKGROUND

Vigorous developments are made for compound semiconductor devices using GaN or GaN series compound semiconductor. GaN has a wide or high band gap of 3.4 eV, and enables a high breakdown voltage operation. Various semiconductor devices can be manufactured using GaN series compound semiconductor.

GaN has a high breakdown voltage, and is expected to be applied to usage requiring high voltage and high speed operation, such as a high electron mobility transistor (HEMT) for a mobile phone base station. There are various reports on GaN-HEMT formed by growing crystals of GaN/AlGaN on a substrate such as sapphire, SiC, GaN and Si and using a GaN layer as an electron transport or channel layer. A value over 300 V is currently reported as a breakdown voltage in an off current state. Transistors utilizing the field effect including HEMT and MESFET may collectively called field effect transistors in some cases.

Metal organic chemical vapor deposition (MOCVD) is mainly used as a crystal growth method. A method called hydride vapor phase epitaxy (H-VPE) is being studied in recent years, which method produces metal chloride by reacting HCl with group III metal and further conducting reaction with ammonia and the like to grow nitride semiconductor.

If a GaN series field effect transistor of a lateral structure disposing a source, a channel and a drain along a substrate surface layer is used as a power device for vehicles or the like, it is difficult to increase a current density per area so that a chip size becomes large. In order to increase a current density per area, it is preferable to use a vertical structure in which carriers move along a substrate thickness direction.

JP-A-2003-051508, JP-A-2004-31896, JP-A-2005-203753, and WO2003/071607, which are incorporated herein by reference, propose a vertical structure that a source is disposed on the top surface of a semiconductor substrate, a drain is disposed on the bottom surface, and a gate is disposed on a vertical side wall formed by vertically etching the substrate from the top surface to an intermediate depth. Since a transistor structure is formed along the depth direction of the substrate, it is expected to increase an area utilization efficiency. With this gate electrode structure formed on a vertical side wall formed by vertically etching the semiconductor layer, processes become complicated, and there is a high possibility of many issues such as process precision and yield.

JP-A-2002-16262, which is incorporated herein by reference, proposes a structure that a source electrode and a gate electrode of interdigital shape are formed on the top surface of a substrate, and a drain electrode is formed on the bottom surface. An $n^+$-type GaN source region is surrounded by a p-type well and an i-type well, and an n-type GaN channel region is formed under the gate electrode traversing the n-type well and the i-type well. Under the n-type channel region, an $n^-$-type GaN layer, an $n^+$-type GaN layer and an $n^{++}$-type Si substrate are disposed. The electrodes are formed on flat surfaces. In order to electrically separate the source region from the substrate bottom side, a recess is formed by etching, and epitaxial growth on the recess is performed for growing the i-type well, the p-type well and the $n^+$-type source region. Further a recess is formed by etching, and epitaxial growth on the recess is performed for growing the channel region. It may become necessary to planarize the epitaxial growth surface. It can be considered that manufacture processes are not simple.

FIG. 5A schematically illustrates the structure of a vertical type GaN-HEMT reported by University of California, Santa Barbara (Conference Digest of Device Research Conference, 2002, pp. 31-32). An n-type GaN layer 102 is grown on a single crystal sapphire substrate 101, and a p-type GaN layer 103 serving as a current blocking layer is formed on the n-type GaN layer 102. The p-type GaN layer 103 is etched to form opening in current flowing region. An n-type GaN layer 105 is grown to fully bury the opening of the current flowing region, and a non-doped GaN active layer 106 serving as an electron transport layer is formed on the p-type GaN layer 103 and the n-type GaN layer 105. An n-type AlGaN layer 108 serving as an electron supply layer is grown above the non-doped GaN layer 106 via an non-doped AlGaN layer 107 serving as a spacer layer. A deep potential well is formed at the interface of the non-dopes GaN layer contacting the AlGaN layer having a wide band gap, so that two dimensional electron gas 2DEG is generated. An n-type GaN layer 109 is grown on the n-type AlGaN layer 108. Isolation is performed by recess etching. A silicon nitride layer 110 is formed on the surface by plasma CVD. The silicon nitride layer on electrode forming areas are removed, and a gate electrode G in Schottky contact and a source electrode S in ohmic contact are formed thereon. The layers down to the n-type GaN layer 102 are etched, and a drain electrode D is formed on the n-type GaN layer 102.

FIG. 5B illustrates the characteristics of the GaN-HEMT thus formed. Drain current Ids does not become zero even in an off-state, i.e. insufficient pinch-off characteristics.

SUMMARY

According to one aspect of the invention, there is provided a compound semiconductor device including:

a conductive semiconductor substrate;

a drain electrode formed on a bottom surface of the conductive semiconductor substrate;

a current blocking layer formed on a top surface of the conductive semiconductor substrate, made of high resistance compound semiconductor or insulator, and having openings;

an active layer of compound semiconductor burying the openings and extending on an upper surface of the current blocking layer;

a gate electrode formed above the opening and above the active layer; and a source electrode laterally spaced from the gate electrode and formed above the active layer.

According to another aspect of the invention, there is provided a method for manufacturing a compound semiconductor device comprising:

(a) forming a current blocking layer on a top surface of a conductive semiconductor substrate, the current blocking layer being made of high resistance compound semiconductor or insulator, and having openings;

(b) forming an active layer of compound semiconductor burying the openings and extending on an upper surface of the current blocking layer;

(c) forming a gate electrode above the opening and above the active layer;

(d) forming a source electrode laterally spaced from the gate electrode and above the active layer; and (e) forming a drain electrode on a bottom surface of the conductive semiconductor substrate.

The high resistance or insulating current blocking layer can enhance current blocking characteristics.

High current blocking effect can be established by using a potential barrier based on the hetero junction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A, 3B, 3C and 3D are a schematic cross sectional view illustrating the structure of a GaN series vertical type HEMT according to a second embodiment of the invention, a graph illustrating carrier concentration profiles in depth direction, a graph illustrating a carrier concentration profile in lateral direction in opening portion, and a graph illustrating I-V characteristics.

DESCRIPTION OF EMBODIMENTS

Figure 5A:
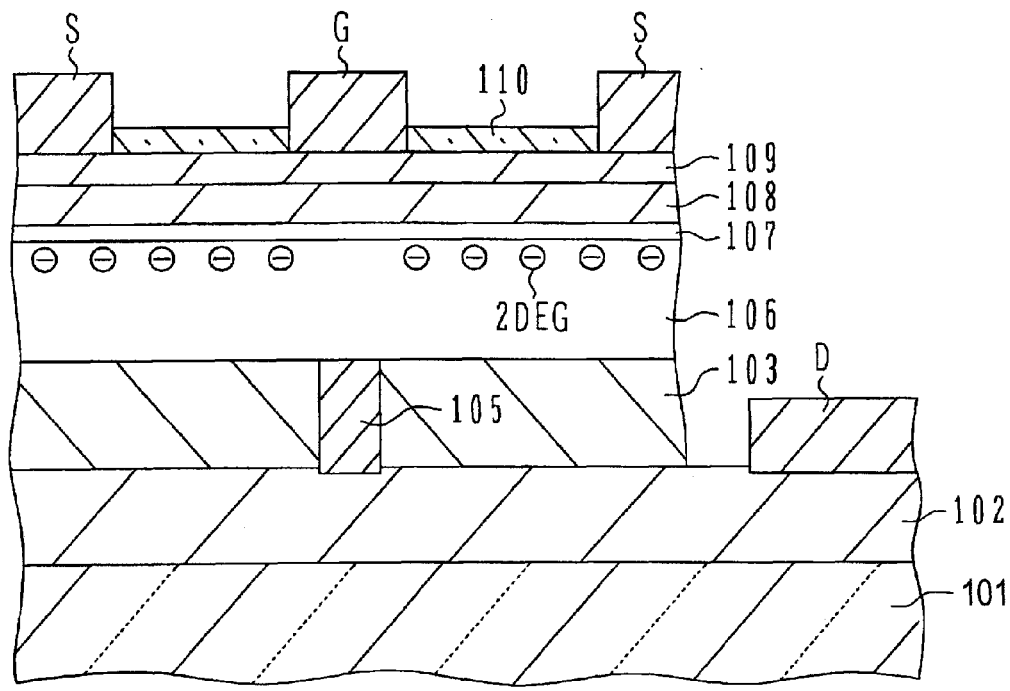
FIGS. 5A and 5B are a cross sectional view illustrating the structure of a GaN series vertical type HEMT according to prior art, and a graph illustrating I-V characteristics thereof.
Figure 5B:
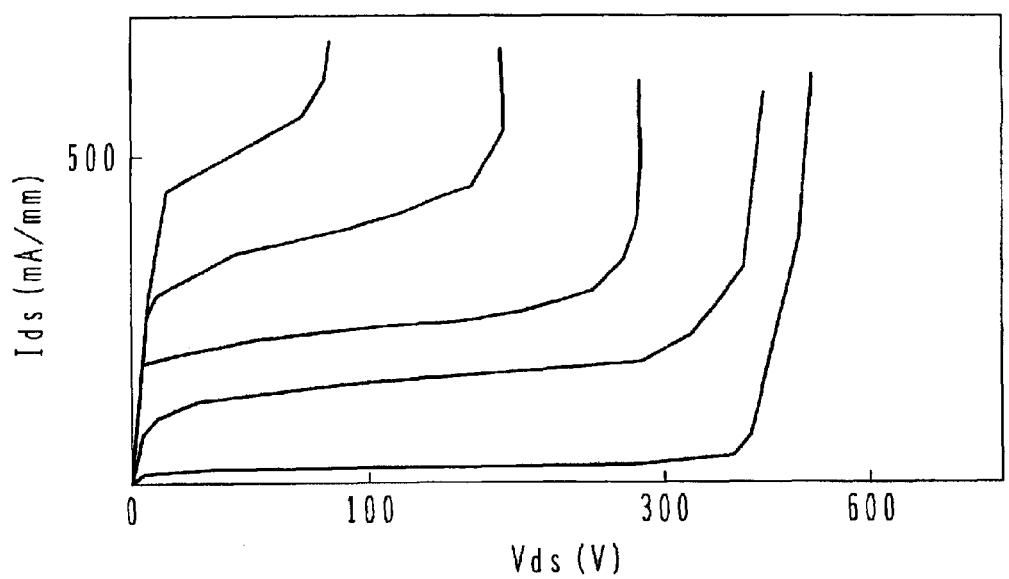

Studies have been conducted for investigating the cause of leak current of GaN series HEMT illustrated in FIG. 5A. The p-type GaN layer 103 formed above the single crystal sapphire substrate 101 via the GaN layer 102 constitutes a current blocking layer. Since the sapphire substrate and GaN have different lattice constants, crystal dislocation occurs so that excellent crystallinity cannot be expected. It is therefore considered that the current blocking function of the p-type GaN layer 103 is imperfect and electrons may move along dislocations through the p-type GaN layer 103. Although the two dimensional electron gas 2DEG in the non-doped GaN layer 106 near at the interface with the non-doped AlGaN layer 107 can be controlled by the gate electrode G, it is difficult for the gate electrode G to control electrons which have moved downwards from the two dimensional electron gas 2DEG. It is desired to suppress motion of electrons downwards from the two dimensional electron gas 2DEG and to enhance the current blocking function of the current blocking layer.

AlN has a larger band gap than that of GaN so that AlN can form a potential barrier for carriers in GaN. It is easy to form an AlN region having a high resistivity. A GaN region contacting the AlN region becomes more p-type and forms a potential barrier for electrons.

Figure 1A:
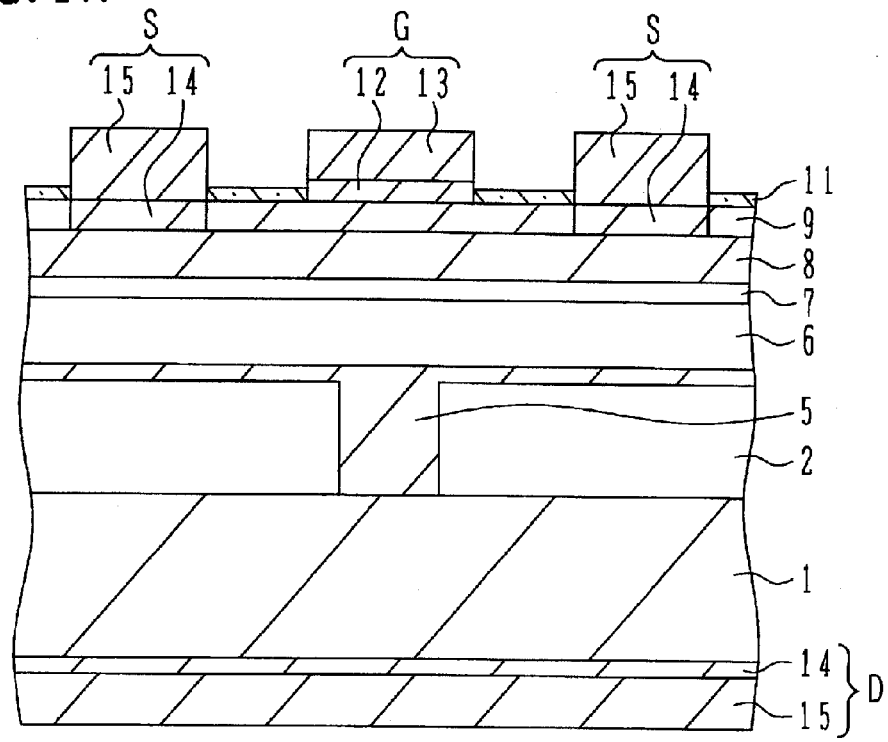
FIGS. 1A and 1B are a schematic cross sectional view and a schematic plan view of a GaN series vertical type HEMT according to a first embodiment of the invention.

FIG. 1A is a schematic cross sectional view illustrating the structure of a GaN series vertical type HEMT according to the first embodiment of the invention. An AlN layer 2 is grown on an n-type single crystal c-plane SiC substrate 1 to a thickness of about 3 μm by hydride (H—) vapor phase epitaxy (VPE).

Figure 2A:
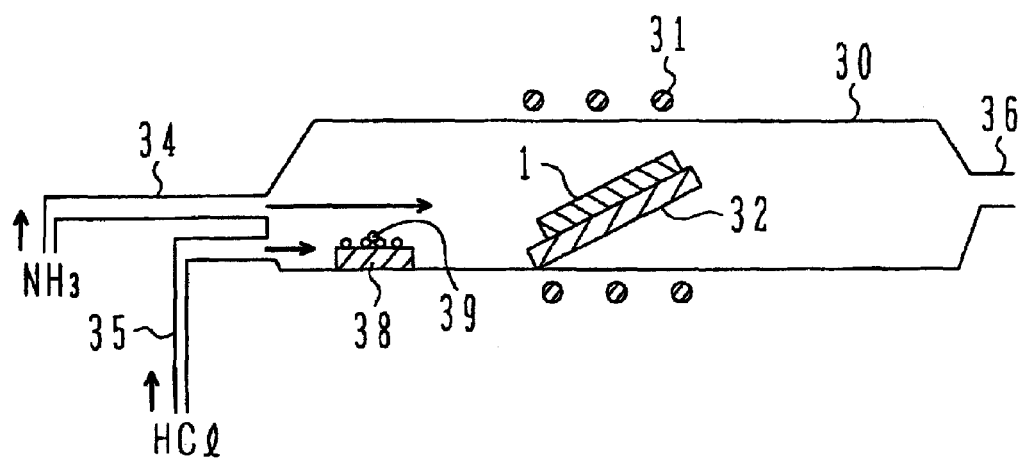
FIGS. 2A and 2B are schematic cross sectional views of a hydride VPE system and an MOCVD system.

FIG. 2A is a schematic cross sectional view illustrating the structure of a hydride VPE system. A high frequency coil 31 for induction heating is wound around a quartz reaction tube 30, and a carbon susceptor 32 for placing thereon a substrate 1 is disposed in the quartz reaction tube. Two gas introducing pipes 34 and 35 are coupled to the upstream end of the reaction tube 30 illustrated left in FIG. 2A, and a gas exhaust pipe 36 is coupled to the downstream end of the reaction tube 30. A boat 38 is disposed in the reaction tube 30 at an upstream position of the susceptor 32, and a source 39 of a group III element of compound to be grown is accommodated in the boat. For example, the source 39 is Al if AlN is to be grown, and Ga if GaN is to be grown. Ammonia $NH_3$ gas is introduced as N source gas via the gas introducing pipe 34, and HCl is introduced via the gas introducing pipe 35. HCl reacts with the group III element source 39 in the boat 38 to produce group III element chloride AlCl. Source gases AlCl and $NH_3$ are transported to the substrate and are allowed to react on the substrate surface to grow AlN. Surplus gas is exhausted via the gas exhaust pipe 36 to a detoxification tower.

An AlN layer 2 is grown to a thickness of about 3 μm on a (0001) plane (c-plane) single crystal conductive SiC substrate 1 by H-VPE. The group III element source 39 in the boat 38 of the H-VPE system is Al. The conditions of H-VPE are set, for example, as follows:

pressure: normal pressure,
gas flow rate: HCl: 100 sccm,
$NH_3$: 10 LM (litter per minute), and
temperature: 1100° C.

A resistivity of the AlN layer 2 can be set extremely high, e.g., higher than $1 \times 10^5$ (represented as 1E5) Ωcm.

A resist mask is formed on the AlN layer 2, and the AlN layer is etched to form openings (each having a size 0.5 μm×500 μm) in current path regions. The resist mask is removed thereafter. Above the SiC substrate 1 and AlN layer 2, a HEMT lamination structure is grown by metal organic chemical vapor deposition (MOCVD).

Figure 2B:
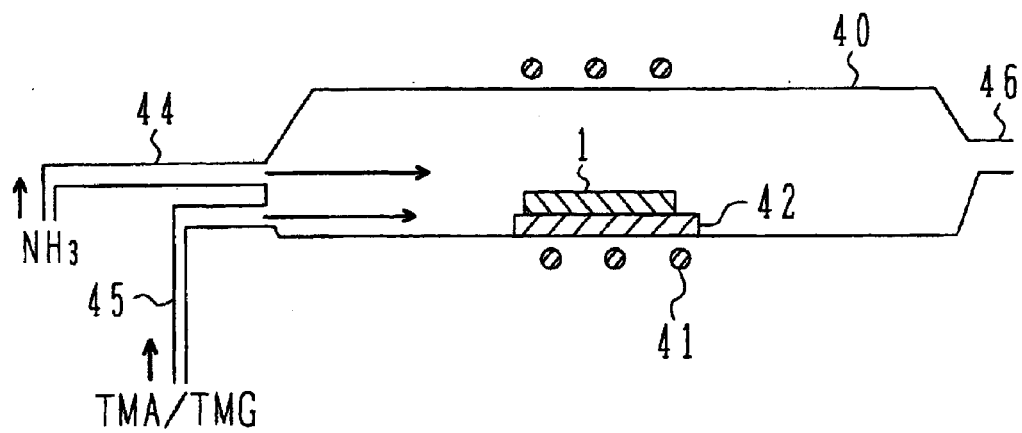

FIG. 2B is a schematic cross sectional view illustrating the structure of an MOCVD system. A high frequency coil 41 is wound around a quartz reaction tube 40, and a carbon susceptor 42 for placing thereon a substrate 1 is disposed in the reaction tube 40. Two gas introducing pipes 44 and 45 are coupled to the reaction tube 40 at the upstream end to supply source gases for compound. For example, $NH_3$ as N source gas is introduced via the gas introducing pipe 44, and organic group III element compound source material such as trimethylaluminum, trimethylgallium and trimethylindium as group III element source gas is introduced via the gas introducing pipe 45. Crystal growth progresses on the substrate 1, and surplus gas is exhausted via the gas exhaust pipe 46 coupled to the reaction tube at a downstream end to a detoxification tower. If MOCVD is to be performed in a low pressure atmosphere, the gas exhaust pipe 46 is coupled to a vacuum pump, and an exhaust port of the vacuum pump is coupled to a detoxification tower.

The conditions of MOCVD are set, for example, as in the following: source materials and flow rates:
   trimethylgallium (TMG): 0 to 50 sccm,
   trimethylaluminum (TMA): 0 to 50 sccm,
   trimethylindium (TMI): 0 to 50 sccm, and
   ammonia ($NH_3$): 20 SLM,
n-type impurity: silane ($SiH_4$),
p-type impurity: biscyclopenta-dienyl-magnesium (Cp2Mg),
pressure: 100 torr, and
temperature: 1100° C.

First, an n-type GaN layer 5 is grown to a thickness of about 3 μm. Since GaN is hard to grow on SiC, an AlGaN layer containing Al at 10 at % or more is grown at an initial growth stage. The n-type GaN layer 5 is thereafter grown. Lateral growth of GaN is much faster than vertical growth. The n-type GaN grows on a side wall of the c-plane AlN layer at a growth speed five times or more of that on the top surface of the c-plane AlN layer. Thus, the n-type GaN layer 5 preferentially buries the openings of the AlN layer 2, and after the openings are buried, step of grown regions above the openings and the top surface of the AlN layer 2 is gradually extinguished by lateral growth.

Surface of the AlN layer is oxidized to some extent during patterning by etching. Oxygen is removed through reaction with ammonia gas. then, it becomes possible to grow GaN. Vertical growth speed remains slower than the lateral growth speed on the side wall.

A non-doped GaN layer 6 is grown to a thickness of about 0.2 μm on the n-type GaN layer 5 doped with Si at $4\times10^{18}$ (represented as 4E18) $cm^{-3}$. The non-doped GaN layer 6 is an active layer serving as an electron transport or channel layer. The GaN layer contacting the flat AlN layer 2 becomes more p-type at its interface due to the piezo effect. The p-type tendency or conductivity raises the potential of the GaN layer near at the interface, and the potential lowers as the position becomes remoter (upper) from the interface. This potential gradient has a direction of expelling or repelling electrons.

A non-doped AlGaN layer 7 is grown to a thickness of about 5 nm on the GaN layer 6, and then an n-type AlGaN layer 8 doped with Si at 4E18 $cm^{-3}$ is grown to a thickness of about 20 nm. The n-type AlGaN layer 8 serves as an electron supply layer for supplying electrons to the active layer 6, and the non-doped AlGaN layer 7 serves as a spacer layer for separating the electron supply layer from the active layer. A deep potential well is formed at the interface of the non-doped GaN layer 6 contacting the AlGaN layer 7 having a wide band gap, and two dimensional electron gas 2DEG is generated thereat.

An n-type GaN layer 9 doped with Si at 5E18 $cm^{-3}$ is grown to a thickness of about 7 nm on the n-type AlGaN layer 8. An isolation region is formed by recess etching. A silicon nitride (SiN) film 11 is deposited on the surface by plasma CVD. A current collapse phenomenon which changes an on-resistance during operation can be avoided by forming the GaN protective layer 9 and SiN layer 11 on and above the n-type AlGaN electron supply layer 8. A resist mask is patterned, and the SiN film is selectively etched and removed with $SF_6$, and then the GaN protective layer 9 is etched and removed with chlorine gas by time-controlled etching, in the ohmic contact region. A Ta film 14 and an Al film 15 on the Ta film are laminated to form a source electrode S.

Similarly, a drain electrode D is formed on the bottom surface of the SiC substrate 1. The SiN film 11 in gate contact region is removed. A resist mask pattern is formed, and an Ni film 12 and an Au film 13 on the Ni film are laminated on the n-type GaN layer 9, to form a gate electrode G by lift-off.

Figure 1B:
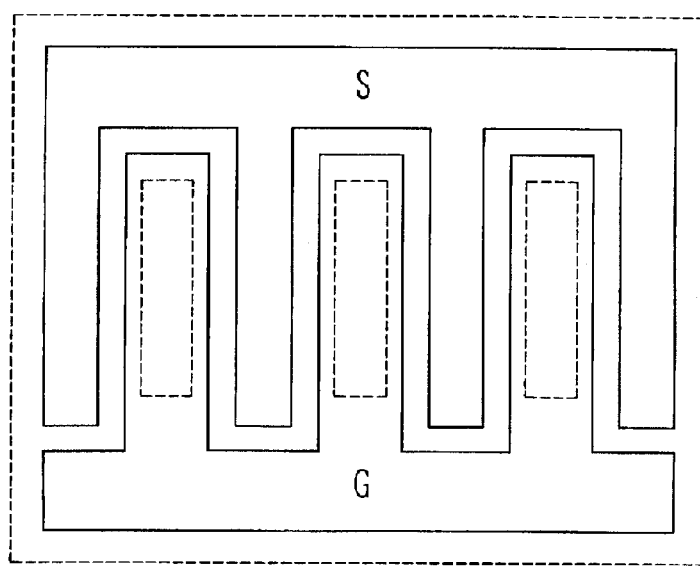

FIG. 1B is a schematic plan view illustrating the layout of the source electrode S and gate electrode G. The stripe-shaped current pass regions are indicated by broken lines. The comb-shape gate electrode G is disposed having teeth covering the current path regions, and the comb-shape source electrode S is disposed having teeth on both sides of each tooth of the gate electrode G. Carriers are supplied from the source electrode portions on both sides of each current pass region, controlled by the gate electrode, and reach the substrate and drain electrode via the current path regions. FIG. 1A is a cross sectional view illustrating a portion of one current pass region and the source electrodes S on both sides of the current pass region. Isolation region is formed outside the element region 10 indicated by a broken line.

According to the embodiment, the interface of the upper GaN layer contacting the flat AlN layer becomes more p-type due to the piezo effect. This p-type tendency raises the potential and suppresses downward motion of electrons from the two dimensional electron gas (2DEG). Further, the AlN layer having a wide band gap blocks pass of electrons. For example, even if electrons enter the AlN layer, the AlN layer itself has a very high resistance. A GaN series vertical type HEMT can be formed having excellent pinch-off current characteristics in an off state. Since the SiC substrate has a high thermal conductivity, a semiconductor device having good heat radiation characteristics can be provided.

Although the AlN current blocking layer is made of the AlN layer having a thickness of about 3 μm, the AlN layer may be made more thicker. Since H-VPE can provide a fast growth speed, an AlN layer having a thickness of, e.g., 10 μm can be grown easily.

Figure 1C:
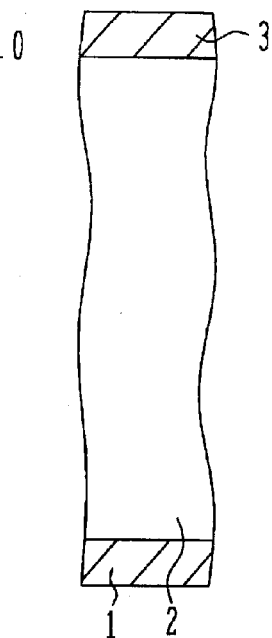
FIG. 1C is a sketch illustrating an epitaxially grown layer according to a modification.

FIG. 1C is a sketch drawn from a TEM photograph taken after an AlN layer 2 is grown to a thickness of about 12 μm on an SiC substrate 1 by H-VPE and a GaN layer 3 is grown on the AlN layer.

Since H-VPE growth also has a function of reducing crystal dislocations, when a thick AlN layer is grown, its crystallinity is expected to be improved. Since an H-VPE grown layer contains Cl, there is a possibility that the electrode contact characteristics may be adversely affected. When an AlN layer, an AlGaN layer, an AlGaInV layer or the like is grown by MOCVD on an AlN layer grown by H-VPE, the MOCVD grown layer can serve as a Cl diffusion blocking layer. Here, an AlN current blocking layer may also be grown by MOCVD. In the first embodiment, the openings formed through the AlN current blocking layer are buried with the n-type GaN layer. Other structures are also possible.

Figure 3A:
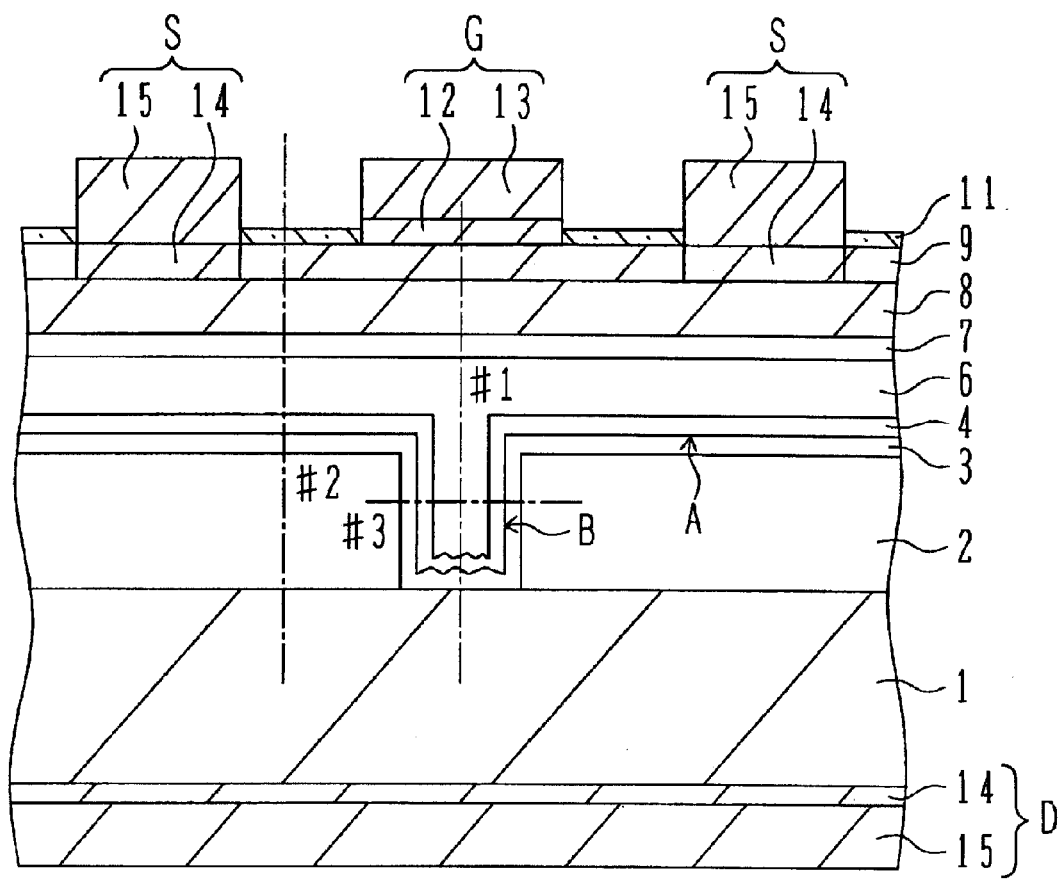

FIG. 3A is a schematic cross sectional view illustrating the structure of a GaN series vertical type HEMT according to the second embodiment of the invention. Similar to the first embodiment, an AlN layer 2 is grown to a thickness of about 3 μm on an n-type single crystal SiC substrate by H-VPE, and openings are formed through the AlN layer in current path regions. An n-type AlGaN layer 3 doped with Si at 1E19 $cm^{-3}$ is grown to a thickness of about 20 nm, above the substrate covering the patterned AlN layer 2, and an n-type GaN layer 4 doped with Si at 1E18 $cm^{-3}$ is grown to a thickness of about 20 nm on the n-type AlGaN layer, by MOCVD. The openings of the AlN layer 2 are not still buried. A non-doped GaN layer 6 is grown on the n-type GaN layer 4 to a thickness of about 0.2 μm above the AlN layer 2, to bury the openings. The non-doped GaN layer 6 is an active layer serving as an electron transport or channel layer. Thereafter, similar to the first embodiment, after a non-doped AlGaN layer 7 is grown to a thickness of about 5 nm on the GaN layer 6, an n-type AlGaN layer 8 doped with Si at 4E18 cm$^{-3}$ is grown to a thickness of about 20 nm. An n-type GaN layer 9 doped with Si at 5E18 cm$^{-3}$ is grown to a thickness of about 7 nm on the n-type AlGaN layer 8. Isolation region is formed by recess etching. A silicon nitride (SiN) film 11 is deposited on the surface by plasma CVD. Similar to the first embodiment, a source electrode S, a gate electrode G and a drain electrode D are formed.

As the n-type AlGaN layer 3 is grown on the patterned AlN layer 2 by MOCVD, external diffusion of Cl in the AlN layer 2 can be suppressed. As the AlGaN layer 3 is grown on the SiC substrate, the GaN layer 4 can be grown on the AlGaN layer 3. As the n-type AlGaN layer 3 and n-type GaN layer 4 are grown on the top surface and side surfaces of the AlN layer 2, the piezo effect occurs at the interface changing from a layer containing Al to a layer not containing Al (an interface A between the n-type AlGaN layer 3 and n-type GaN layer 4) on the upper surface portion of AlN. At the same time, the piezo effect occurs also at the interface between the upper surface of the AlN layer 2 and the AlGaN layer 3. The GaN layer 4 near at the interface therefore becomes more p-type, its potential is raised and the pinch-off characteristics in an off state can be improved more than the first embodiment. In contrast, the piezo effect does not occur at the interface between the layer containing Al and the layer not containing Al (an interface B between the n-type AlGaN layer 3 and n-type GaN layer 4) on the side surface of the AlN layer at the openings. This is because the crystal is hexagonal, and bonding of atoms is different between a direction perpendicular to the substrate surface (c-axis direction) and a direction parallel to the substrate surface (a-axis direction). Therefore, on the side surface, only the n-type junction effect occurs and two dimensional electron gas is generated. Therefore, resistance in the vertical direction reduces. On the opening bottom, the n-type AlGaN layer 3 and n-type GaN layer 4 are laminated on the SiC substrate 1. Although the piezo effect is expected to occur essentially, the piezo effect does not apparently occur because of poor flatness of the AlGaN layer on the SiC substrate. Conversely, there occurs island growth on the bottom of the openings, to which Si impurities may easily invade, the n-type impurity concentration becomes high (5E19 cm$^{-3}$) at the bottom portion. The n-type AlGaN layer 3 doped with Si at 5E19 cm$^{-3}$ is an n-type conductive layer and allows a drain current to flow vertically at a low resistance.

FIG. 3B is a graph illustrating a carrier concentration in a depth direction in a center portion #1 of the current pass region under the gate electrode G and in a portion #2 where the AlN current blocking layer 2 exists. A right hand side region of a broken line is the SiC substrate. In the center portion #1 of the current path region, a carrier concentration decreases from the two dimensional electron gas 2DEG with the depth, and abruptly increases in the n-type GaN layer 4 and n-type AlGaN layer 3 above the SiC substrate at a central portion of the opening. In the portion #2 passing through the AlN layer, since the n-type GaN layer 4 and n-type AlGaN layer 3 above and on the AlN layer 2 become more p-type, carriers will not increase and continue to decrease in the high resistance AlN layer 2.

Figure 3C:
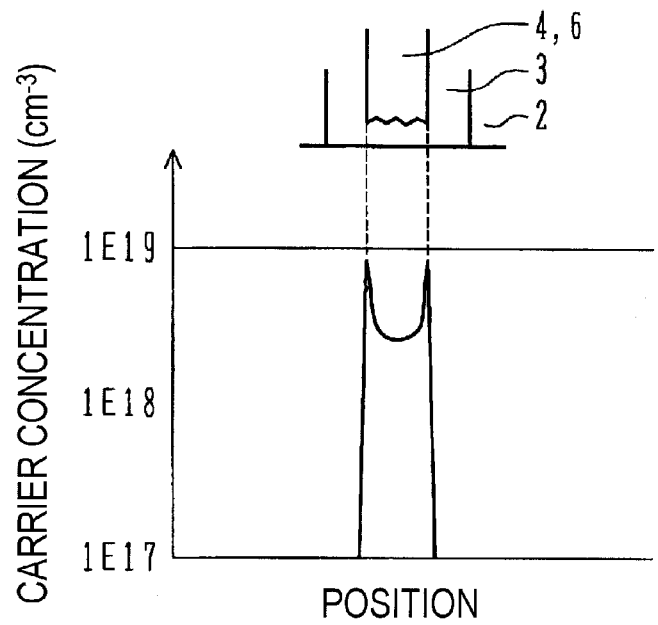

FIG. 3C illustrates a carrier concentration along a horizontal direction indicated by #3 in FIG. 3A and traversing the AlN current blocking layer 2, and the n-type AlGaN layer 3, n-type GaN layer 4 and GaN layer 6 in the opening. The interface between the n-type GaN layer 4 and n-type AlGaN layer 3 becomes more n-type and generates two dimensional electron gas. This high mobility two dimensional electron gas provides the effect of decreasing resistance in a vertical direction.

Figure 3D:
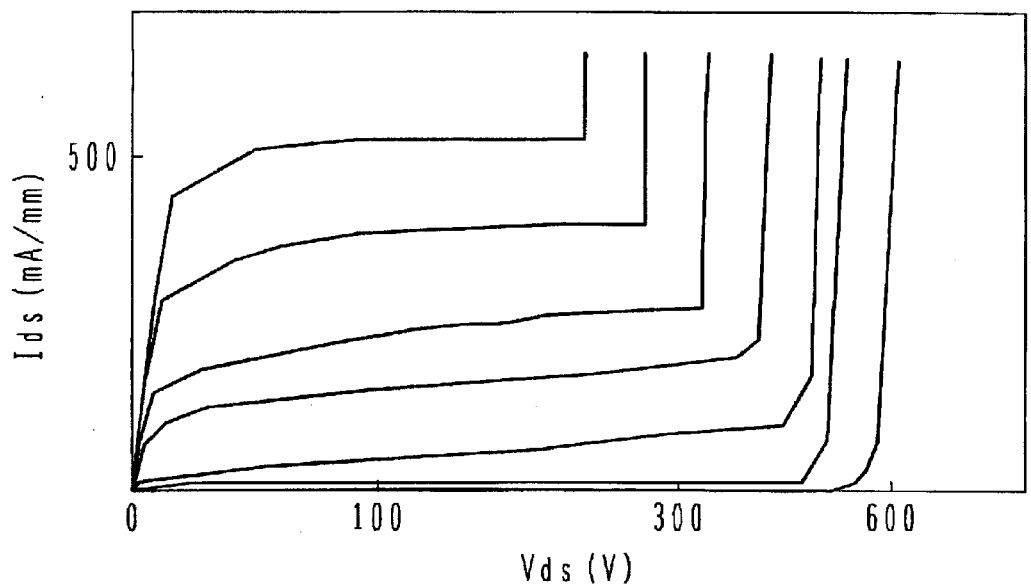

FIG. 3D illustrates I-V characteristics of the GaN series vertical type HEMT of the second embodiment. In the off state, a drain current is pinched off providing good off characteristics. A resistance in an on state was improved by 20% from that of the first embodiment.

In the first and second embodiments, the current blocking layer is made of a high resistance AlN layer. The current blocking layer may be made of an insulating layer.

Figure 4A:
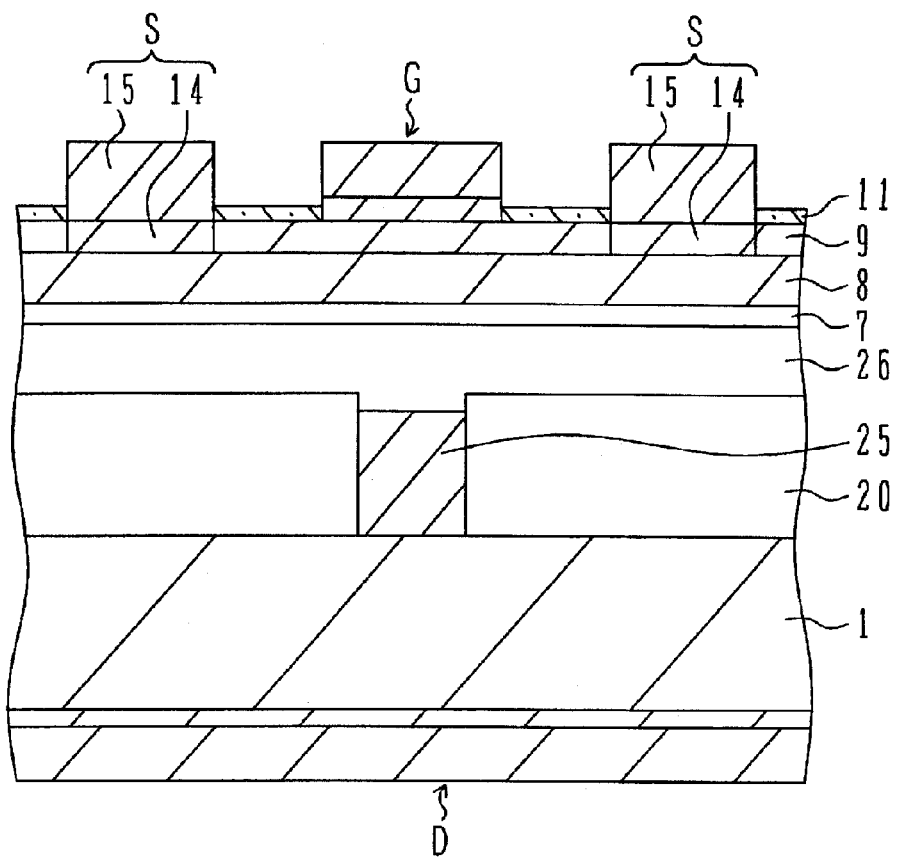
FIGS. 4A and 4B are a schematic cross sectional view illustrating the structure of a GaN series vertical type HEMT according to a third embodiment of the invention, and a graph illustrating I-V characteristics.

FIG. 4A is a schematic cross sectional view illustrating the structure of a GaN series vertical type HEMT according to the third embodiment. An SiO$_2$ layer 20 is deposited to a thickness of about 3 μm on a single crystal n-type SiC substrate 1 by CVD, and patterned to form current pass regions. An n-type GaN layer 25 is grown to a thickness of about 3 μm by MOCVD on the SiC substrate 1 with the patterned SiO$_2$ layer 20, by adding Al at 10 at % or more at the initial growth stage. The GaN layer 25 is not grown on the insulating layer, but selectively grown in the openings. When the GaN layer grows exceeding the upper edge of the opening, lateral growth begins. Although the n-type GaN layer 25 may be grown to the level flush with the upper surface of the SiO$_2$ layer 20, the GaN layer is grown only inside the openings here. A non-doped GaN layer 26 is grown by MOCVD on the n-type GaN layer 25 and SiO$_2$ layer 20, to a thickness of about 0.2 μm on the SiO$_2$ layer 20. Thereafter, similar to the first and second embodiments, a non-doped AlGaN layer 7 is grown to a thickness of about 5 nm on the non-doped GaN layer 26, and thereafter, an n-type AlGaN layer 8 doped with Si at 4E18 cm$^{-3}$ is grown to a thickness of about 20 nm. An n-type GaN layer 9 doped with Si at 5E18 cm$^{-3}$ is grown on the n-type AlGaN layer 8 to a thickness of about 7 nm. Isolation region is formed by recess etching. A silicon nitride (SiN) film 11 is deposited on the surface by plasma CVD. A source electrode S, a gate electrode G and a drain electrode D are formed.

Figure 4B:
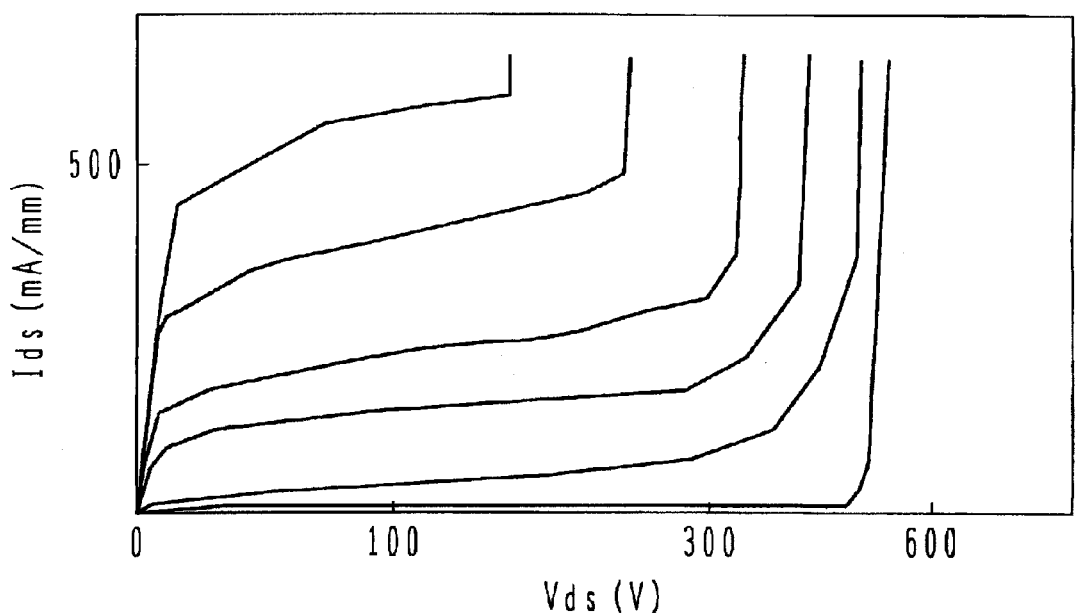

FIG. 4B illustrates I-V characteristics of the GaN series vertical HEMT of the third embodiment. A drain current slightly flows in an off state.

According to the third embodiment, since the current blocking layer is made of insulator, leak current passing through the current blocking layer is extremely small. As compared to the current blocking layer made of the p-type GaN layer, the current blocking effect can be apparently improved. As compared to the first and second embodiments, the effect of raising a potential in the lower portion of the non-doped GaN layer 26 by the piezo effect is not provided. Therefore, electrons can move downward from the two dimensional electron gas 2DEG in an off state, and there is a large possibility that electrons are transported in the GaN layer near the upper surface of the SiO$_2$ layer 20 and reach the openings.

Although the invention has been described in conjunction with the embodiments, the invention is not limited to the embodiments. For example, instead of single crystal SiC, single crystal GaN may be used for the substrate. The current blocking layer may be made of insulator other than silicon oxide, such as a silicon nitride and silicon oxynitride. The size, impurity concentration and the like illustratively described above may be changed in various ways. Instead of HEMT, other vertical type field effect transistors may be formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the inventions have been described in detail, it should be understood that the various changes, substitutions, and alterations could be made hereto without departing from the spirit and scope of the invention.

I claim:

1. A method for manufacturing a compound semiconductor device comprising:
    (a) forming a current blocking layer on a top surface of a conductive semiconductor substrate, said current blocking layer being made of high resistance compound semiconductor, and having openings;
    (b) forming an active layer of compound semiconductor burying said openings and extending on an upper surface of said current blocking layer;
    (c) forming a gate electrode above said openings and above said active layer;
    (d) forming a source electrode laterally spaced from said gate electrode and above said active layer; and
    (e) forming a drain electrode on a bottom surface of said conductive semiconductor substrate; wherein:
    said conductive semiconductor substrate is made of SiC or GaN;
    said step (a) includes:
    (a-1) growing an AlN layer on said conductive semiconductor substrate; and
    (a-2) patterning said AlN layer to form said openings exposing said conductive semiconductor substrate, and
    said step (b) includes:
    (b-1) growing a doped GaN layer in an area including said openings; and
    (b-2) growing a non-doped GaN layer on said doped GaN layer.

2. The method for manufacturing a compound semiconductor device according to claim 1, wherein said step (b) includes (b-3) growing a doped AlGaN layer between said AlN layer and said doped GaN layer.

3. The method for manufacturing a compound semiconductor device according to claim 2, wherein said step (a-1) grows AlN by H-VPE, and said step (b-3) grows doped AlGaN by MOCVD.

4. A method for manufacturing a compound semiconductor device comprising:
    (a) forming a current blocking layer on a top surface of a conductive semiconductor substrate, said current blocking layer being made of insulator, and having openings;
    (b) forming an active layer of compound semiconductor burying said openings and extending on an upper surface of said current blocking layer;
    (c) forming a gate electrode above said openings and above said active layer;
    (d) forming a source electrode laterally spaced from said gate electrode and above said active layer; and
    (e) forming a drain electrode on a bottom surface of said conductive semiconductor substrate;
    wherein
    said conductive semiconductor substrate is made of SiC or GaN;
    said step (a) includes:
    (a-1) depositing a silicon oxide layer on said conductive semiconductor substrate; and
    (a-2) patterning said silicon oxide layer to form said openings exposing said conductive semiconductor substrate, and
    said step (b) includes:
    (b-1) growing a doped GaN layer in an area including said openings; and
    (b-2) growing a non-doped GaN layer on said doped GaN layer.

5. The method for manufacturing a compound semiconductor device according to claim 4, wherein said step (b) further includes (b-4) growing a non-doped AlGaN spacer layer on said non-doped GaN layer, and (b-5) growing an n-type AlGaN carrier supply layer on said non-doped AlGaN spacer layer.

6. The method for manufacturing a compound semiconductor device according to claim 5, further comprising:
    (f) forming a GaN protective layer on said n-type AlGaN carrier supply layer; and
    (g) forming a silicon nitride film on said GaN protective layer.

7. The method for manufacturing a compound semiconductor device according to claim 6, further comprising:
    (h) selectively removing the silicon nitride film in gate areas to expose areas of the GaN protective layer;
    wherein said step (c) includes forming gate teeth of the gate electrode on exposed areas of the GaN protective layer.

8. The method for manufacturing a compound semiconductor device according to claim 7, further comprising (i) selectively removing the silicon nitride film and the GaN protective layer in source areas to expose areas of the n-type AlGaN carrier supply layer, and said step (d) forms source teeth of the source electrode on exposed areas of the n-type AlGaN carrier supply layer.

9. A method for manufacturing a compound semiconductor device comprising:
    providing a conductive semiconductor substrate;
    forming a drain electrode on a bottom surface of said conductive semiconductor substrate;
    growing a current blocking layer on a top surface of said conductive semiconductor substrate, made of high resistance compound semiconductor, and having openings;
    growing an active layer of compound semiconductor burying said openings and extending on an upper surface of said current blocking layer;
    forming a gate electrode above said openings and above said active layer; and
    forming a source electrode laterally spaced from said gate electrode and above said active layer;
    wherein said conductive semiconductor substrate is made of SiC or GaN, and said current blocking layer is made of AlN, and
    wherein said growing active layer includes growing an n-type AlGaN layer on the AlN current blocking layer, and growing a GaN layer on the n-type AlGaN layer.

10. The method for manufacturing a compound semiconductor device according to claim 9, wherein said growing a GaN region includes growing an n-type GaN layer on said n-type AlGaN layer, and growing a non-doped GaN layer on said n-type GaN layer.

* * * * *